United States Patent
Lin et al.

(10) Patent No.: US 8,138,076 B2
(45) Date of Patent: Mar. 20, 2012

(54) MOSFETS HAVING STACKED METAL GATE ELECTRODES AND METHOD

(75) Inventors: Cheng-Tung Lin, Jhudong Township (TW); Yung-Sheng Chiu, Hsin-Chu (TW); Hsiang-Yi Wang, Hsin-Chu (TW); Chia-Lin Yu, Sigang (TW); Chen-Hua Yu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 92 days.

(21) Appl. No.: 12/118,919

(22) Filed: May 12, 2008

(65) Prior Publication Data

US 2009/0280632 A1 Nov. 12, 2009

(51) Int. Cl.
*H01L 21/3205* (2006.01)
*H01L 21/4763* (2006.01)

(52) U.S. Cl. ............. 438/591; 438/592; 257/E21.625; 257/E21.635

(58) Field of Classification Search .............. 438/216, 438/591, 592; 257/E21.625, E21.635, E21.639, 257/E21.463, E21.462
See application file for complete search history.

(56) References Cited

U.S. PATENT DOCUMENTS

| | | | |
|---|---|---|---|
| 5,604,152 A * | 2/1997 | Chen et al. ............ | 438/482 |
| 6,049,114 A * | 4/2000 | Maiti et al. ............ | 257/412 |
| 7,303,996 B2 | 12/2007 | Wang et al. | |
| 7,368,392 B2 | 5/2008 | Choi et al. | |
| 7,563,715 B2 * | 7/2009 | Haukka et al. ......... | 438/680 |
| 2004/0219789 A1 * | 11/2004 | Wood et al. ........... | 438/690 |
| 2005/0009311 A1 * | 1/2005 | Barnak et al. ......... | 438/585 |
| 2006/0153995 A1 * | 7/2006 | Narwankar et al. ..... | 427/569 |
| 2007/0018244 A1 | 1/2007 | Hung et al. | |
| 2007/0052036 A1 * | 3/2007 | Luan et al. ............ | 257/369 |
| 2007/0099438 A1 * | 5/2007 | Ye et al. ............... | 438/778 |
| 2007/0262348 A1 * | 11/2007 | Park et al. ............ | 257/204 |
| 2008/0142893 A1 * | 6/2008 | Hung et al. ........... | 257/368 |
| 2008/0217747 A1 * | 9/2008 | Chudzik et al. ....... | 257/635 |
| 2008/0242108 A1 * | 10/2008 | Chang et al. ......... | 438/763 |
| 2009/0108350 A1 * | 4/2009 | Cai et al. ............. | 257/347 |
| 2009/0152651 A1 * | 6/2009 | Bu et al. .............. | 257/411 |
| 2009/0302399 A1 * | 12/2009 | Cartier et al. ........ | 257/407 |
| 2011/0254063 A1 * | 10/2011 | Chen et al. ........... | 257/288 |

FOREIGN PATENT DOCUMENTS

| | | |
|---|---|---|
| CN | 1577751 A | 2/2005 |
| CN | 1604278 A | 4/2005 |

* cited by examiner

*Primary Examiner* — Caridad Everhart
(74) *Attorney, Agent, or Firm* — Slater & Matsil, L.L.P.

(57) ABSTRACT

MOSFETs having stacked metal gate electrodes and methods of making the same are provided. The MOSFET gate electrode includes a gate metal layer formed atop a high-k gate dielectric layer. The metal gate electrode is formed through a low oxygen content deposition process without charged-ion bombardment to the wafer substrate. Metal gate layer thus formed has low oxygen content and may prevent interfacial oxide layer regrowth. The process of forming the gate metal layer generally avoids plasma damage to the wafer substrate.

15 Claims, 7 Drawing Sheets

MOSFETS HAVING STACKED METAL GATE ELECTRODES AND METHOD

TECHNICAL FIELD

The present invention relates generally to structures of metal oxide semiconductor field effect transistors (MOSFETs) in integrated circuits and methods of making the same, and more particularly to MOSFETs having stacked metal gate electrodes, and methods of fabricating the same.

BACKGROUND

While the scaling down of the device feature size in a semiconductor integrated circuit (IC) continues in the pursuit of smaller, faster, and more complex circuit functions on a single integrated circuit, maintaining high drive current at scaled voltages and smaller MOSFET gate dimensions generally becomes more important. Device drive current is closely related to parameters such as gate dimension, gate capacitance, and carrier mobility. Among the various technology innovations made to maintain high MOSFET drive current, high-k (dielectric constant) gate dielectrics and metal gate electrodes are commonly adopted to increase gate capacitance of MOSFETs in advanced technology.

Silicon oxide ($SiO_2$) is widely used as gate dielectric layer for MOSFETs. However, device feature size scaling in advanced technology may lead to a very thin gate $SiO_2$ layer and, thus, the gate leakage current may become unacceptably large. High-k gate dielectrics may be used to replace $SiO_2$ (k=3.9) gate dielectric in a sense that high-k gate dielectrics provide a thicker gate dielectric layer and hence leak less, while being able to maintain a desired large gate capacitance and thus a large device drive current. Drive current performance also may be improved through the use of metal gates. Compared to a conventional polysilicon (poly) gate, the use of metal gates tends to increase device drive current by eliminating the poly depletion effect.

In an existing high-k, metal gate MOSFET fabrication approach, hafnium oxide $HfO_2$ (k=20) or zirconium oxide $ZrO_2$ (k=23) are used as high-k materials to form the gate dielectric layer. Such high-k materials are typically deposited on a substrate sensitive to oxidation (e.g., silicon or germanium) by a deposition process, such as atomic layer deposition (ALD). In practice, an interfacial oxide layer is commonly formed on a substrate before the deposition of the high-k materials. The interfacial oxide layer may facilitate the formation of the nucleation sites that enhance the desired metallic precursor adsorption, and hence improve the quality of the high-k gate dielectric layer. A layer of metal is then deposited by a deposition process, such as physical vapor deposition (PVD), chemical vapor deposition (CVD), AVD atomic vapor deposition (AVD), ALD, or plasma-enhanced ALD (PEALD), forming the gate metal layer. A poly cap layer may be subsequently deposited over the metal gate layer in an effort to adapt the high-k, metal gate MOSFET fabrication processes to an existing CMOS manufacturing flow. A photolithography and gate stack etching process may then be performed to form the gate electrode. After that, a conventional source/drain implantation process may be conducted, followed by one or more strong thermal cycles, such as a flash annealing, laser annealing, rapid thermal annealing (RTA) used in conventional semiconductor manufacturing middle of the line (MOL) and back end of the line (BEOL) processing flows.

However, the existing high-k, metal gate MOSFET fabrication approach is problematic in at least the following ways. Firstly, when a PVD process (e.g., plasma sputtering) is used in metal gate deposition, the ion bombardment involved may cause plasma damage in the high-k gate dielectric and interfacial layer, and thus lead to carrier mobility degradation. Secondly, when non-PVD (e.g., CVD, AVD, ALD and PEALD) techniques are employed to form the gate metal layer, they tend to generate a high oxygen content within the deposited film. Moisture may also be absorbed in the film due to the lower density of the film thus formed. The oxygen content and the existence of moisture in the deposited metal film and the necessity of performing thermal cycles in the MOL and BEOL process flows may lead to an increase of the interfacial oxide layer, a phenomenon known as interfacial oxide layer regrowth. This problem may cause a significant MOSFET EOT increase, threshold voltage shift, among others detrimental effects. Thirdly, the process of forming the gate metal layer and the process of depositing the poly cap layer are typically carried out in separate processing facilities. The deposited metal films may be oxidized and absorb moisture when standing in the queue for the poly cap layer deposition. Replacement of the existing deposition tools may be very costly.

SUMMARY OF THE INVENTION

These and other problems are generally solved or circumvented, and technical advantages are generally achieved, by preferred embodiments of the present invention which provide an MOSFET having stacked metal gate electrodes and methods of making the same. The MOSFET gate electrode includes a gate metal layer formed atop a high-k gate dielectric layer. The metal gate electrode is formed through a low oxygen content deposition process without charged-ion bombardment to the wafer substrate. Metal gate layer thus formed has low oxygen content and may prevent interfacial oxide layer regrowth. The process of forming the gate metal layer generally avoids plasma damage to the wafer substrate.

In accordance with a preferred embodiment of the present invention, a method for making a metal oxide semiconductor field effect transistor (MOSFET) comprises forming a high-k dielectric layer on a semiconductor substrate, forming a first metal layer on the high-k dielectric layer, the first metal layer having low oxygen content, and forming a second metal layer on the first metal layer.

In accordance with another preferred embodiment of the present invention, a method for making a gate electrode of a MOSFET comprises forming an interfacial oxide layer on a silicon substrate, forming a high-k gate dielectric layer on the interfacial oxide layer, forming a gate metal layer on the high-k dielectric layer, the metal layer having low oxygen content, and forming a gate cap layer on the gate metal layer.

In accordance with a further preferred embodiment of the present invention, a method for making a semiconductor device comprises providing a semiconductor substrate, forming an interfacial oxide layer at a first region and a second region on the substrate, forming a high-k dielectric layer on the interfacial oxide layers at the first and the second regions, and forming a first metal layer on the high-k dielectric layer at the first and the second regions, where the first metal layer has low oxygen content.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely MOSFETs having a high-k gate dielectric layer and a stacked metal gate electrode with reduced or minimized plasma damage and interfacial layer regrowth, and a method of forming the same. Embodiments of the present invention may also be applied, however, to other transistor structures and methods of fabrication thereof. Cross-sectional views of processing steps are shown for fabricating MOSFETs in preferred embodiments using a CMOS manufacturing process flow. While only one NMOS and one PMOS transistors are shown in each figure, there may be many transistors formed simultaneously on a single semiconductor workpiece.

Figure 1:
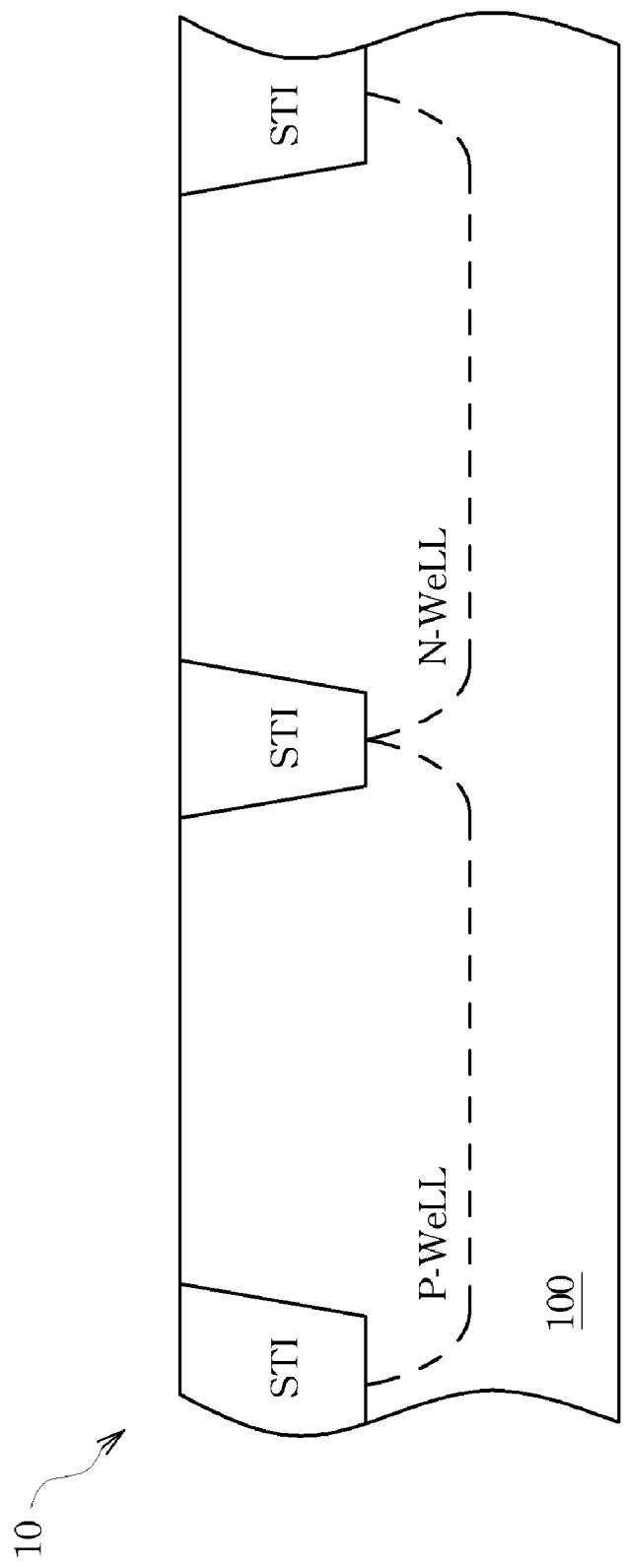
FIGS. 1-3 are cross-sectional views of process steps for the fabrication of an embodiment of MOSFETs with a high-k gate dielectric layer and a metal gate electrode.

With reference now to FIG. 1, there is shown a portion of a cross-sectional view of wafer 10. Wafer 10 comprises substrate 100, which is typically a P-type monocrystalline silicon (Si) epitaxial layer on a bulk Si substrate, but may also be made of gallium arsenide (GaAs), gallium arsenide-phosphide (GaAsP), indium phosphide (InP), gallium aluminum arsenic (GaAlAs), indium gallium phosphide (InGaP), and the like. Alternatively, substrate 100 could be a semiconductor layer formed on an insulating layer, in a silicon-on-insulator (SOI) wafer configuration.

The first step in creating MOSFETs in one preferred embodiment is forming the isolation regions that separate the active regions where MOS transistors will later be formed. A typical local oxidation of silicon (LOCOS) process may be performed to grow thermal field oxides, which will separate the active MOS transistor regions. In advanced processing technology that allows tighter spacing between the different types of transistors, shallow trench isolations (STIs) filled typically with silicon oxide ($SiO_2$) are formed in substrate 100, as shown. The STIs electrically isolate one active region from another and prevent metal or conductive poly lines from creating unwanted transistors outside the active regions.

After the isolation regions are formed, substrate 100 is doped to prepare for the different types of MOSFETs. A doped N-well region is formed for the creation of a PMOS transistor, and a doped P-well region is formed for the creation of an NMOS transistor. In doing so, a first photolithography and ion implantation process cycle may be used to create a retrograde N-well with the highest concentration of dopant beneath the surface of the substrate 100. After the N-well is formed, a second photolithography and ion implantation process cycle may be performed to create a retrograde P-well. Processes that create both wells are commonly referred to as twin-well processes. Alternatively, it is also possible to make use of the background doping of P-type substrate 100 and only form N-wells in the substrate, and vice versa when an N-type material is used an a substrate. The process steps up until this point have prepared the die for the formation of the MOS transistors in preferred embodiments.

Figure 2:
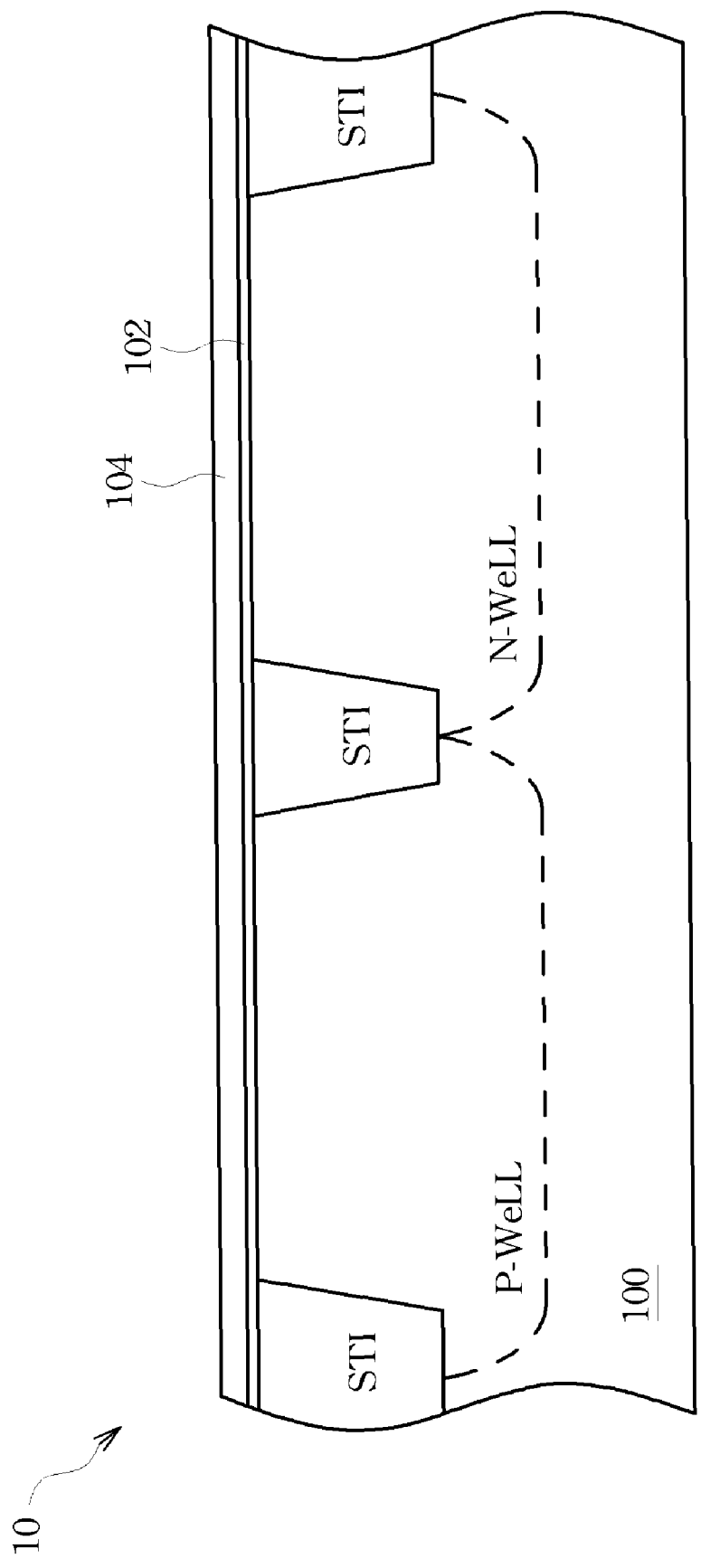

Shown in FIG. 2, an interfacial oxide layer 102 is formed on substrate 100. In one preferred embodiment, interfacial oxide layer 102 of about 4 angstroms (Å) is formed through a chemical cleaning process. Wafer 10 is submerged in a diluted HF solution for pre-gate substrate cleaning. A native oxide is thus grown on the substrate surface as interfacial oxide layer 102. An ultraviolet (UV) curing process is then performed to densify the just formed interfacial oxide layer 102, improving film quality and reduce the interfacial oxide layer 102 thickness. Alternatively, interfacial oxide layer 102 may be also formed through a thermal oxidation process, such as a dry or wet oxidation process typically used to form gate oxide layer of a MOS transistor. However, the thickness of an interfacial oxide layer thus formed is typically greater than that of interfacial oxide layer formed through the chemical cleaning process described above, which provides the desired controllability when forming very thin interfacial oxide layers used in advanced technology.

Remaining in FIG. 2, high-k material selected preferably from metal oxides of the IV-B group, such as $HfO_2$, $ZrO_2$, $TiO_2$, HfSiO, HfLaO, HfZrO, are then deposited on wafer 10 by a deposition process of PVD type, which involves a PVD metal deposition process followed by an oxygen annealing process. The high-k material may be also formed through a metal oxide deposition of an ALD type, such as ALD, PEALD, radical assisted atomic layer deposition (RAALD), and the like. The ALD process consists of performing successive depositions of atomic layers at low temperature, which enables possible reactions between the metal oxide and the substrate. In one preferred embodiment, ALD type deposition of a thin, high-k dielectric layer 104 of $HfO_2$ is performed on wafer 10 by repetition of a reaction cycle. The reaction cycle successively comprises a step of injecting a halogenated metallic precursor, for example, $HfCl_4$, into the reactor, a first reactor purging step, a step of injecting water into the reactor, and a second reactor purging step. The reaction cycle is generally repeated until a thin layer 104 of $HfO_2$ of about 20 Å is obtained. The thin layer 104 of high-k material is preferably subject to a post-deposition annealing step designed to stabilize the thin layer 104 thermodynamically and reduce the defects in high-k film 104. In other preferred embodiments, thin layer 104 may be also formed with other techniques, such as CVD, metal-organic chemical vapor deposition (MOCVD), sputtering, molecular beam epitaxial deposition (MBE), and other suitable techniques known in the art, including various combinations or variations of the foregoing. Furthermore, high-k materials other than metal oxides of the IV-B group as described above, such as $Si_3N_4$ (k=6.5~7.5) may also be used to form thin layer 104. Thin layer 104 will be patterned in subsequent processing steps to form the high-k gate dielectric layer of MOSFETs in preferred embodiments.

It is noted that, through the description of the preferred embodiments, a reactor used to form the various process layers in a MOSFET may be also interchangeably referred to as a process reactor, a chamber, or a process chamber.

Figure 3:
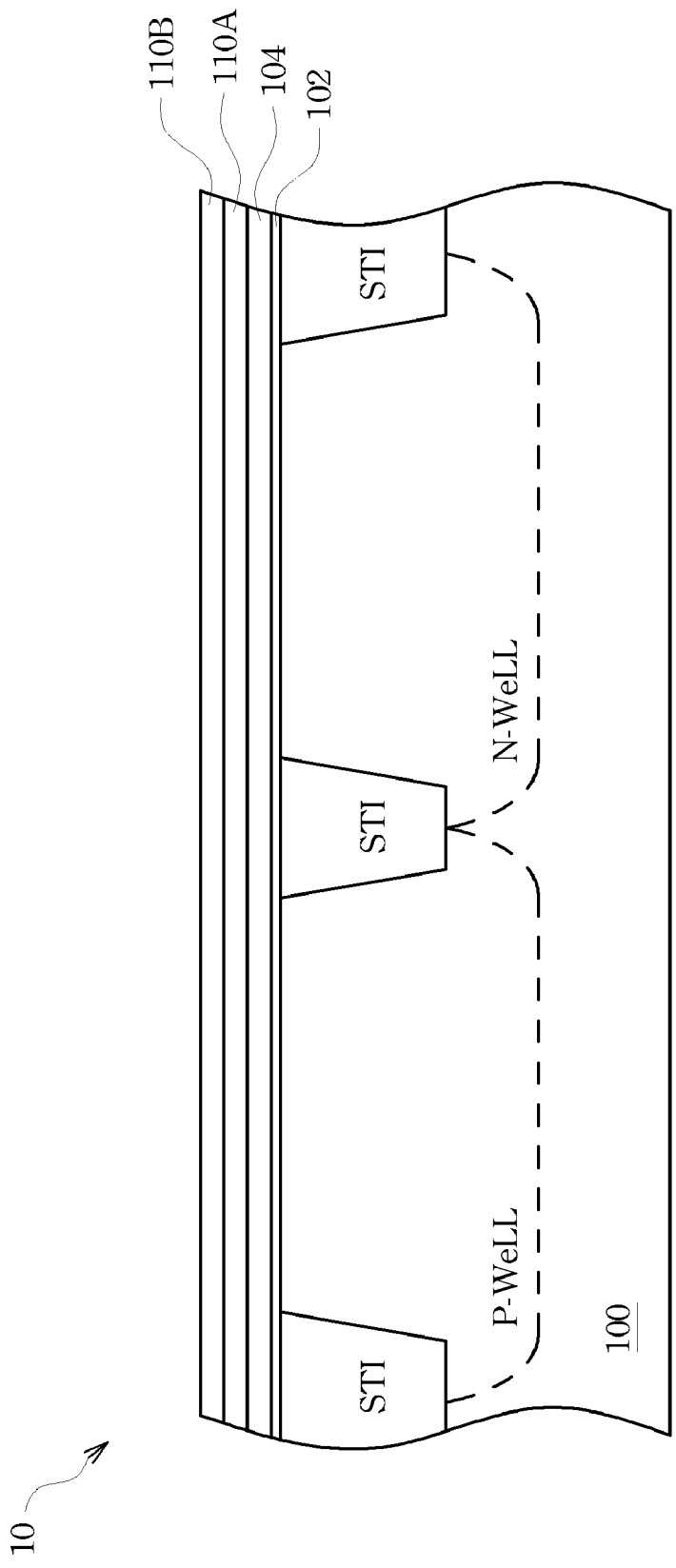

Continuing in FIG. 3, a first gate metal layer 110A is deposited on wafer 10, comprising a conductive metal material selected from the group consisting of Mo, W, Pt, TiN, TaN, TaC, WN, Mo$_2$N, WN, TiAlN, TaAlN, Nb, Ir, Os, Ru, Nb oxides, Ir oxides, Os oxides, Ru oxides, and various combinations of the foregoing with their base materials, either as mixtures, alloys or multilayer structures, although other suitable metal gate materials may be also used. The deposition process used to form first gate metal layer 110A is preferably an low-oxygen-content deposition process type without charged-ion bombardment, such as low-oxygen-content CVD or atomic vapor deposition (AVD), although other suitable deposition processes may be also used. An AVD deposition process and a thermal ALD deposition process, generally comprise performing successive depositions of atomic layers at a higher temperature and favorably enable degassing oxygen content from first gate metal layer 110A, but do not involve charged-ion bombardment on the wafer. In one preferred embodiment, a thermal ALD deposition process is performed on wafer 10 to form first gate metal layer 110A of TiN by repetition of a reaction cycle. The reaction cycle successively comprises a step of injecting a halogenated metallic precursor, such as TiCl$_4$, into a first process reactor of a clustered deposition tool, a first reactor-purging step, a step of injecting reactive gases NH$_3$ into the first process reactor, and a second reactor-purging step. The reaction cycle is generally repeated until first gate metal layer 110A of TiN of about 50 Å is obtained. In another preferred embodiment, a low-oxygen AVD process is used to form first gate metal layer 110A of TaN of about 50 Å. The reaction comprises a steady inflow of reactive gases into a first process reactor of a clustered deposition tool and successive pulsed injections of metal-organic precursor into the first process reactor. The metal-organic precursor is purged from the first process reactor between each one of the successive metal-organic precursor injections.

Also shown in FIG. 3, a second gate metal layer 110B is deposited on wafer 10 after the deposition of first gate metal layer 110A. Materials used to form second gate metal layer 110B may be same or different from those used to form first gate metal layer 110A. Various materials may be used for forming second gate metal layer 110B. These materials include, but are not limited to, Mo, W, Pt, TiN, TaN, TaC, WN, Mo$_2$N, WN, TiAlN, TaAlN, Nb, Ir, Os, Ru, Nb oxides, Ir oxides, Os oxides, Ru oxides, and combinations of the foregoing with their base materials, either as mixtures, alloys or multilayer structures, although other suitable materials may be also used. In one preferred embodiment, the materials used to form second gate metal layer 110B are similar to those used to form first gate metal layer 110A. Moreover, the deposition process used to form second gate metal layer 110B is similar to that used to form first gate metal layer 110A, and is preferably conducted in a same or a different process reactor of the same clustered deposition tool. This prevents the wafers-under-process from transferring between different deposition tools in an open-air environment, which may create undesirable effects, such as metal layer oxidation and moisture absorption. In other preferred embodiments, however, the materials used to form second gate metal layer 110B may be different from those used to form first gate metal layer 110A, and second gate metal layer 110B may be formed through a variety of processes conducted in process chambers in different clustered deposition tools. These processes include ALD, CVD, PEALD, RAALD, PVD, sputtering, MBE, and other suitable techniques, including various combinations or variations of the foregoing. In one preferred embodiment, a PVD deposition process is performed to form second metal layer 110B of TiN of about 50 Å atop first gate metal layer 110A of TiN of about 50 Å previously obtained through a thermal ALD deposition process. The deposition of first gate metal layer 110A and second metal layer 110B may be performed in process chambers of a common clustered deposition tool.

Figure 4A:
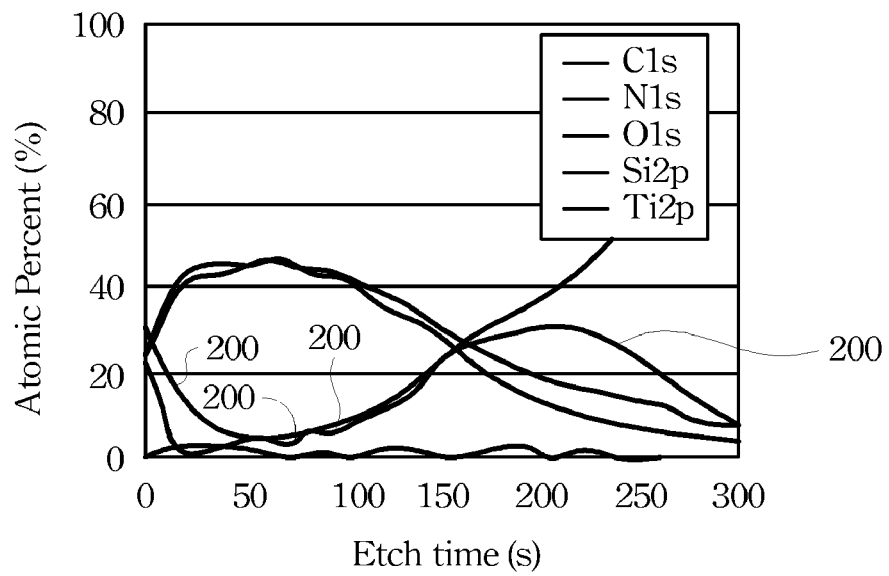
FIG. 4 compares the oxygen content in an embodiment metal gate electrode of a MOSFET with that in a prior art counterpart.
Figure 4B:
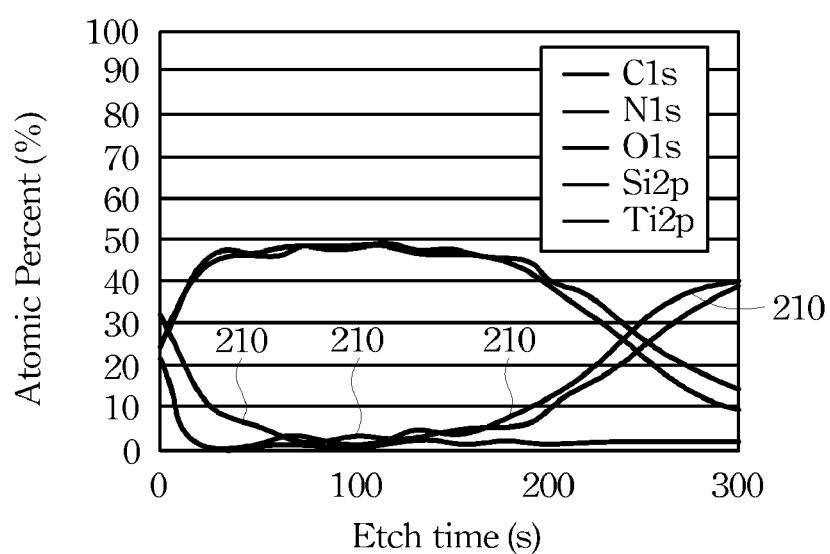

FIGS. 4A-4B illustrate the oxygen content, along with other atomic elements, in a gate metal layer formed through a deposition process according to prior art metal gate MOSFETs, and the oxygen content in first gate metal layer 110A formed through a deposition process according to one preferred embodiment of the present invention, respectively. For comparison purposes, two thin layers of TiN with a thickness of 50 Å are respectively deposited on an oxidized layer of one and the same silicon substrate. A first TiN layer is deposited through a PEALD process typically performed to form a metal gate of prior art MOSFETs, and a second TiN layer is deposited through a thermal ALD process performed in one preferred embodiment. The oxygen content in the two TiN layers is respectively determined by X-ray photoelectron spectroscopy, also known as XPS. In doing an XPS depth profiling, the percentages of the various atomic elements on the top surface of the TiN layers are first obtained through XPS. The measured atomic percentages are recorded and plotted. The TiN layers are then respectively striped by a very thin layer, e.g., 5 Å, through a sputter etch process. The surface atomic percentages are again measured by XPS, and the results are recorded and plotted. This XPS measuring sequence is repeated until the TiN layers are substantially removed from the oxidized SiO$_2$ layer. The removal of the TiN layers may be signaled by a sudden and significant increase of oxygen content, which corresponds to the contribution of the underlying SiO$_2$ layer.

FIG. 4A illustrates the oxygen content (line 200), along with other atomic elements, in the TiN layer according to a prior art deposition process. FIG. 4B illustrates the oxygen content (line 210), along with other atomic elements, in the TiN layer according to the deposition process used to form the first gate metal layer 110A in one preferred embodiment. It is demonstrated through the comparison that the oxygen content in the first gate metal layer 110A of one preferred embodiment is significantly lower (about 2%) than that in the TiN layer according to prior art (about 6%~8%).

Figure 5:
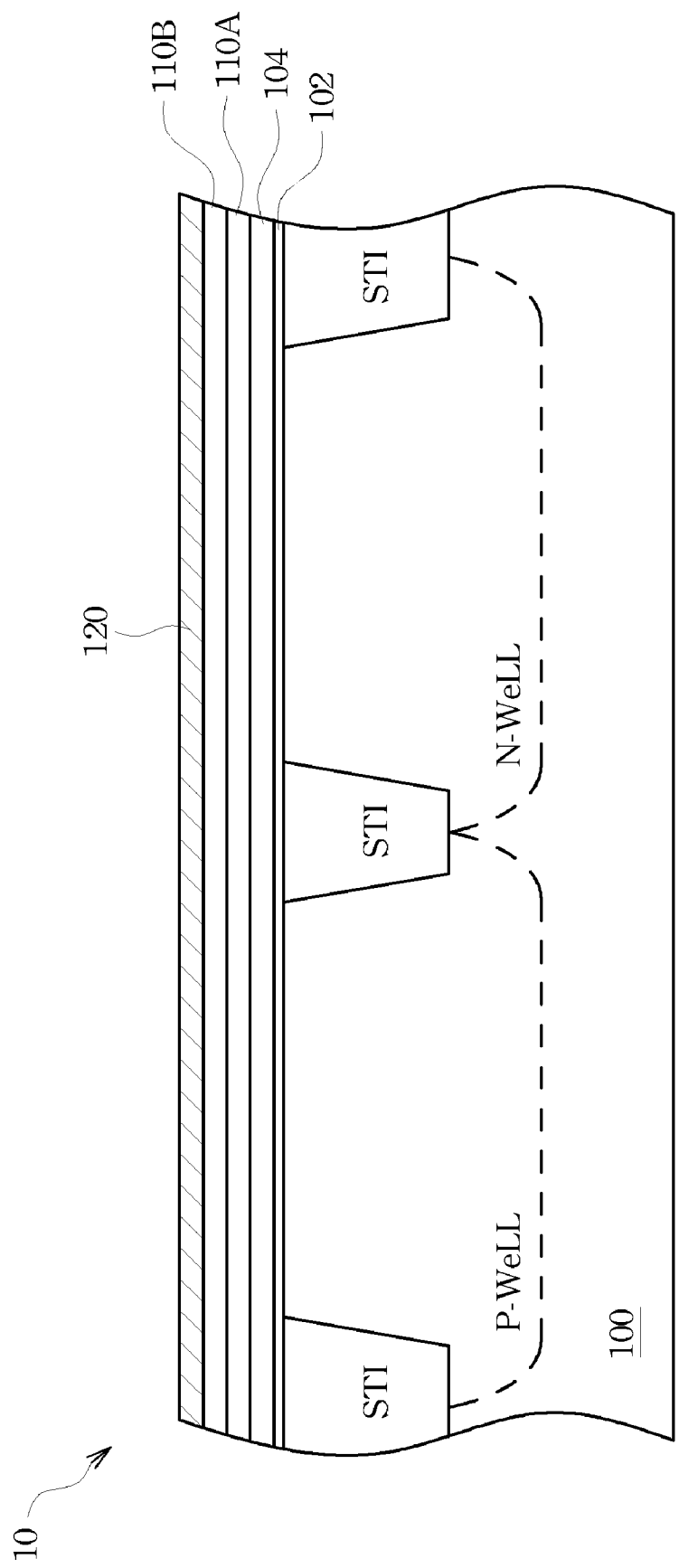
FIGS. 5-6 are cross-sectional views of process steps for the fabrication of an embodiment of MOSFETs with a high-k gate dielectric layer and a metal gate electrode.

Continuing in FIG. 5, an additional deposition process may be performed to form polysilicon cap layer 120 after the deposition of second gate metal layer 110B. Poly cap layer 120, along with first and second gate metal layers 110A and 110B, will be patterned in subsequent processing steps to form the stacked gate electrode structure of MOSFETs in preferred embodiments. Various deposition processes may be used for forming poly cap layer 120. In one preferred embodiment, poly cap layer 120 is grown or deposited by a low-pressure chemical vapor deposition (LPCVD) process at between about 500° C. to about 800° C. The poly cap layer 120 growth uses SiH$_4$ as reactive gas in an LPCVD process chamber at total pressure from about 0.3~1.0 Torr. Poly cap layer 120 thus formed has a thickness of about 600 Å. In another preferred embodiment, an atmospheric-pressure chemical vapor deposition (APCVD) process is performed between about 600° C. to about 800° C. to form poly cap layer 120. In case the poly-Si deposition is performed in a separate process tool than that used to form the metal gate layers, the wafers exposed to an atmospheric environment during the wafer transfer need first to be processed in an oxide reduction chamber or a dual-module degas process chamber before the poly cap deposition process is conducted.

Figure 6:
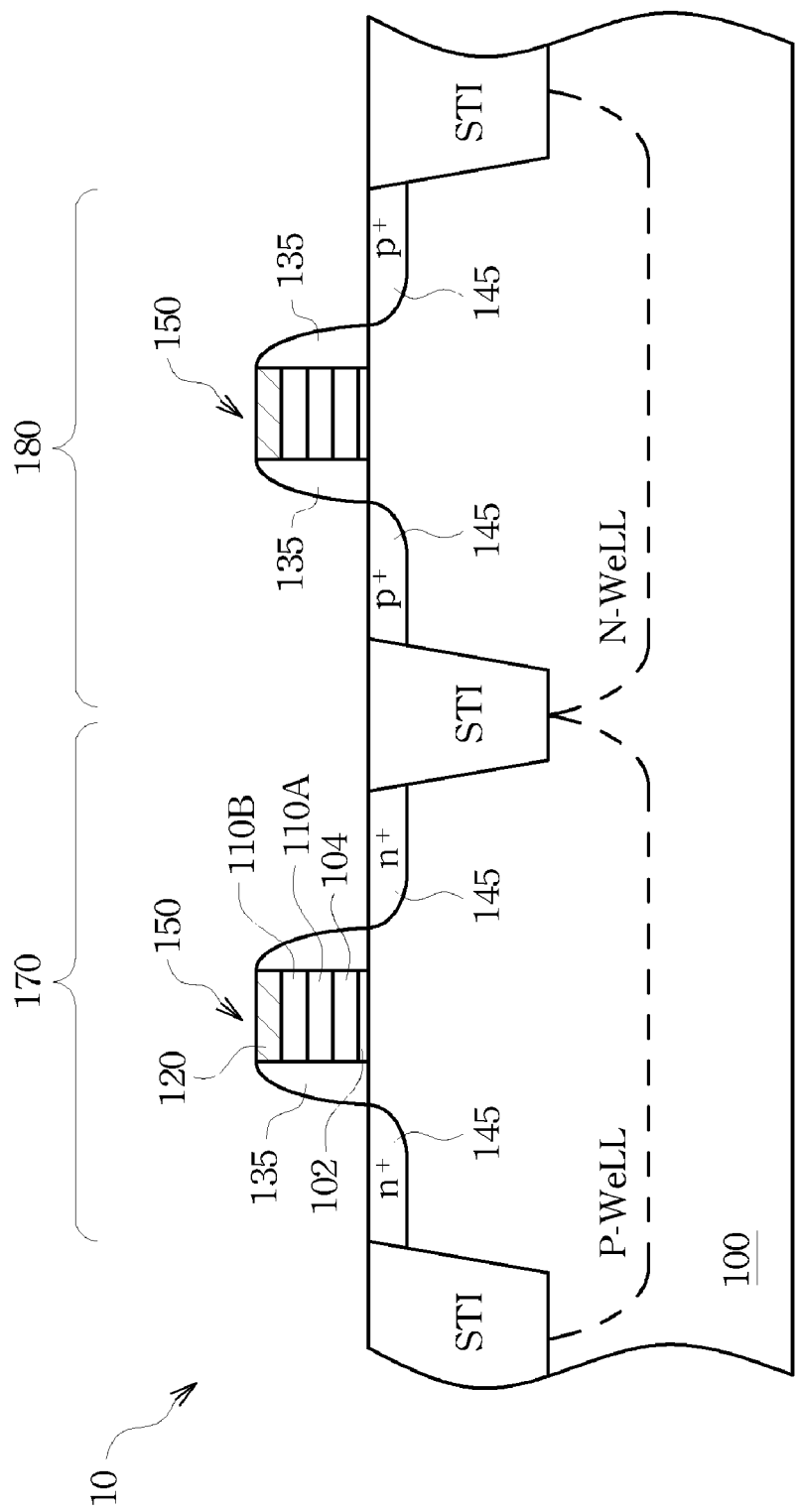

Shown in FIG. 6, the process of making MOSFETs in preferred embodiments may proceed by patterning the various dielectric and conductive layers formed on substrate 100 and forming stacked metal gate electrodes 150 of the NMOS transistor 170 and PMOS transistor 180, using known photolithography and dry etch processes, for example. Each of the metal gate electrodes 150 has a stacked structure that comprises interfacial oxide layer 102, high-k dielectric layer 104, first gate metal layer 110A, second gate metal layer 110B, and poly cap layer 120, one on top of the other. It is noted that FIG. 6 is drawn only to illustrate the stacked gate electrode structure of MOSFETs in preferred embodiments, and is not drawn to scale. In one preferred embodiment, the thickness of high-k dielectric layer 104 is about 20 Å, the combined thickness of the gate metal layers 110A and 110B is about 100 Å, and the thickness of poly cap layer is about 600 Å. After the formation of metal gate electrodes 150, an existing BEOL process flow may be performed to complete the fabrication of MOSFETs in preferred embodiments. The BEOL process flow may comprise various known processing steps, such as doping of polysilicon layer 120, spacer 135 formation, N+ and P+ source/drain 145 implantation followed by high temperature thermal annealing, forming a silicide layer on the top surface of gate electrodes 150 and source/drain 145, and so on.

The process of forming metal gate electrodes 150 having a stacked-metal-layer structure as described above provides a number of benefits over the prior art process used to fabricate MOSFETs having a single-metal-layer gate electrode. For example, the low-oxygen-content, charged-ion-free deposition process used to form first gate metal layer 110A permits high-k gate dielectric layer 104 to be formed with little or substantially reduced plasma damage, because charged-ion bombardment typically associated with a PVD deposition process is not involved. Moreover, the process of forming metal gate electrodes 150 having a stacked-metal-layer structure as described above overcomes the interfacial oxide layer regrowth problem for at least the following reason. First gate metal layer 110A obtained through the preferred deposition processes has a low oxygen content, thus there is little oxygen content to migrate to interfacial oxide layer 102 during later thermal processes, such as a high temperature activation annealing. This may prevent the regrowth of interfacial oxide layer 102.

In another preferred embodiment, the deposition process used to form poly cap layer 120 is carried out in a process chamber of the same clustered deposition tool that is used to form first gate metal layer 110A and second gate metal layer 110B. Also, the deposition of poly cap layer 120 may use a same or a different deposition technique used to form first gate metal layer 110A and second gate metal layer 110B. These deposition techniques may include ALD, CVD, PEALD, RAALD, PVD, sputtering, MBE, and other suitable techniques. Advantageous features of this embodiment may include at least, but are not limited to the following, that this approach eliminates transferring the wafers-under-process from a metal deposition tool to a poly deposition tool in a semiconductor fabricating facility (FAB) according to the prior art. As recognized by those skilled in the art, transferring wafers in an open-air environment may cause oxidation of the deposited gate metal materials, and the deposited metal layer may also absorb moisture in the air. These undesired effects may significantly increase the oxygen content in the deposited metal layers, thus causing metal layer oxidation and facilitating interfacial oxide layer 102 regrowth during later thermal processes, such as a high temperature activation annealing. Also, these effects may worsen when a long queuing period is needed before the deposition of poly cap layer 120 can be carried out, which may commonly occur in a FAB with fully-loaded processing tools. Under severe conditions, additional processing steps may have to be carried out to remove the metal oxidation layers formed atop the gate metal layers.

Figure 7:
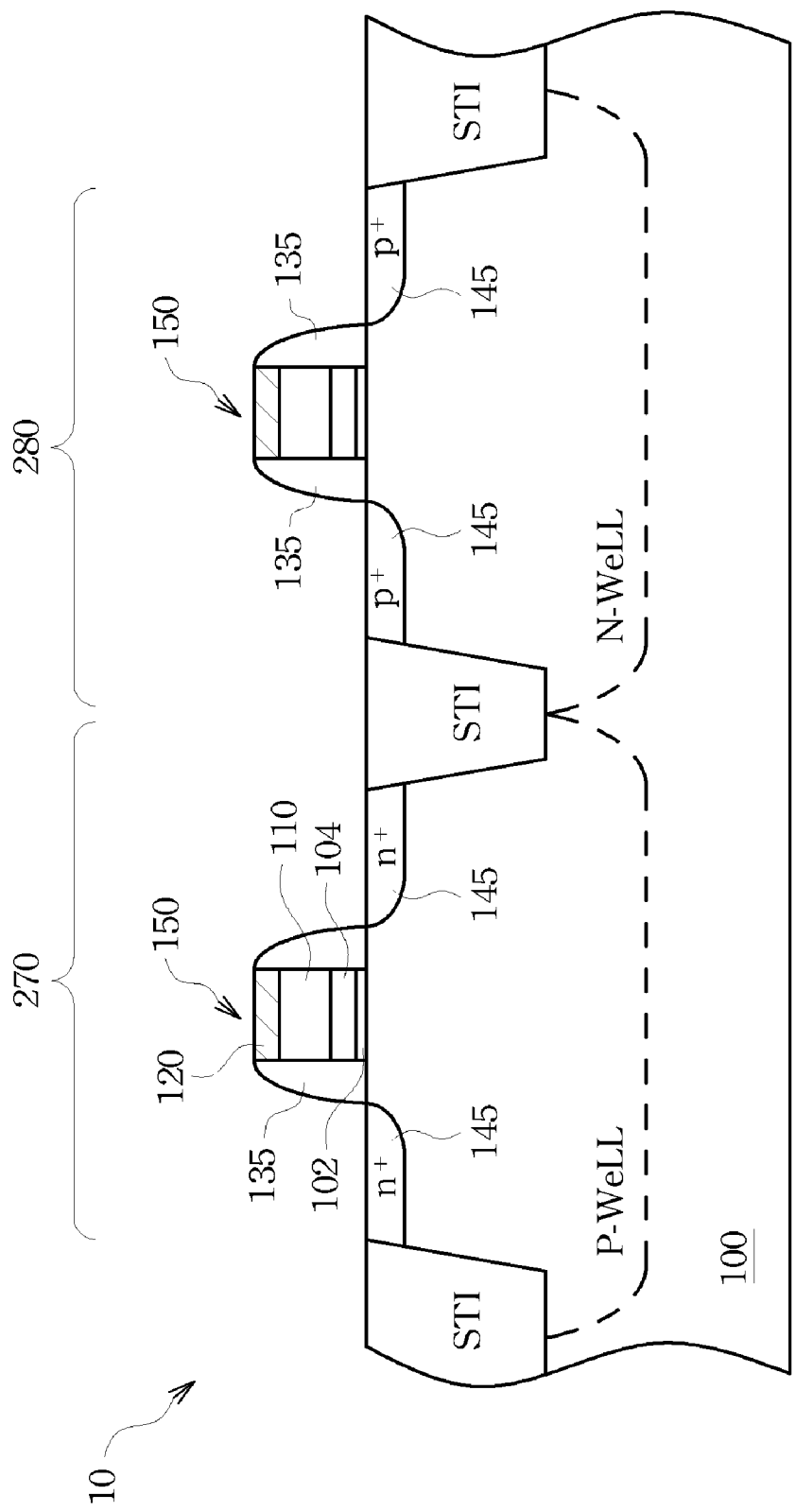
FIG. 7 is cross-sectional view of an illustrative embodiment of MOSFETs with a high-k gate dielectric layer and a metal gate electrode.

FIG. 7 illustrates MOSFETs in a further preferred embodiment of the current invention. To simplify description, like numerals and letters are used for the various elements in FIG. 7 as were used in FIG. 6, and elements described in FIG. 6 may not be described again in detail. NMOS transistor 270 and PMOS transistor 280 in the current embodiment each has a transistor configuration including a high-k gate dielectric layer 104 and metal gate layer 110. Materials used to form metal gate layer 110 are similar to those used to form first gate metal layers 110A of MOSFETs described with respect to FIG. 6. Similarly, the materials of metal gate layer 110 comprise a material selected from the group consisting of Mo, W, Pt, TiN, TaN, TaC, WN, $Mo_2N$, WN, TiAlN, TaAlN, Nb, Ir, Os, Ru, Nb oxides, Ir oxides, Os oxides, Ru oxides, and various combinations of the foregoing with their base materials, either as mixtures, alloys or multilayer structures, although other suitable materials may be also used. Also, NMOS transistor 270 and PMOS transistor 280 are formed through a CMOS manufacturing process flow similar to those used to form the MOSFETs described previously. However, unlike MOSFETs in FIG. 6, NMOS transistor 270 and PMOS transistor 280 in the current embodiment each comprises a single gate metal layer 110. More preferably, gate metal layer 110 is formed through a low-oxygen-content deposition process type without charged-ion bombardment, such as the thermal ALD or AVD processes used to form first gate metal layer 110A of MOSFETs in FIG. 6. Advantageous features can be readily appreciated by those skilled in the art. First, gate metal layer 110 prevents interfacial oxide layer 102 regrowth in a similar manner as explained previously with respect to gate metal layer 110A of MOSFETs in FIG. 6. Second, the uniformity of gate metal layer 110 may be precisely controlled due to the layer-by-layer approach of a thermal ALD or AVD deposition process. This current embodiment may be especially favorable when the gate metal layer uniformity is preferred to deposition rate. In one preferred embodiment, a low-oxygen-content AVD process is used to form gate metal layer 110 of TaN of about 100 Å. In another preferred embodiment, a low oxygen content thermal ALD process is used to form gate metal layer 110 of TiN of about 100 Å.

In an additional and/or alternative embodiment, ploy cap layers 120 of MOSFETs in FIG. 7 are deposited in a process chamber of the same clustered deposition tool that is used to form gate metal layers 110. Also, the deposition of poly cap layer 120 may use a same or a different deposition technique used to form gate metal layer 110. These deposition techniques may include ALD, CVD, PEALD, RAALD, PVD, sputtering, MBE, and other suitable techniques. Advantageous features of forming gate metal layers 110 and poly cap layer 120 in same or different chambers in a same clustered deposition tool is that wafers-under-process are transferred in a vacuum environment and the additional metal oxide reduction chamber or the dual-module degas chamber described with respect to FIG. 5 is no longer needed. In one preferred embodiment, a PECVD process is performed in a first process chamber to form poly cap layer 120 of about 600 Å atop gate metal layer 110 of TaN of about 100 Å, which is grown in a second low-oxygen-content AVD process chamber in a same clustered deposition process tool. In another preferred embodiment, a PECVD process is performed in a first process chamber to form poly cap layer 120 of about 600 Å atop gate metal layer 110 of TiN of about 100 Å, which is grown in a second low-oxygen-content thermal ALD process chamber in a same clustered deposition process tool.

Although the present invention and its advantages have been described in detail, it should be understood that various changes, substitutions and alterations can be made herein without departing from the spirit and scope of the invention as defined by the appended claims. As an example, additional embodiments can be readily contemplated through combining the various features in the preferred embodiments described above. As another example, it will be readily understood by those skilled in the art that materials, process steps, process parameters in forming the preferred embodiments may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for making a metal oxide semiconductor field effect transistor (MOSFET), the method comprising:
   forming a high-k dielectric layer on a semiconductor substrate;
   forming a first metal layer on the high-k dielectric layer, the first metal layer having low oxygen content;
   forming a second metal layer on the first metal layer;
   reducing an amount of oxygen within the second metal layer; and
   forming a polysilicon (poly) cap layer on the second metal layer.

2. The method of claim 1 wherein the first and the second metal layer each comprises a material selected from the group consisting of: Mo, W, Pt, TiN, TaN, TaC, WN, $Mo_2N$, WN, TiAlN, TaAlN, Nb, Ir, Os, Ru, Nb oxides, Ir oxides, Os oxides, Ru oxides, and combinations thereof.

3. The method of claim 1 wherein forming the first and the second metal layer are conducted in process chambers of a same cluster tool.

4. The method of claim 1 wherein the high-k dielectric layer comprises a material selected from the group consisting of: $HfO_2$, $ZrO_2$, $TiO_2$, HfSiO, HfLaO, HfZrO, and combinations thereof.

5. The method of claim 1 wherein forming the first metal layer is performed through a substantially non-plasma, and low oxygen content deposition process.

6. The method of claim 5 wherein the deposition process comprises a process selected from the group consisting of: an atomic vapor deposition (AVD) process, a thermal atomic layer deposition (ALD), a chemical vapor deposition (CVD) process, and combinations thereof.

7. The method of claim 1 further comprising patterning the high-k dielectric layer, the first and the second metal layer, and the poly cap layer to form a gate electrode of the MOSFET.

8. The method of claim 7 wherein forming the high-k dielectric layer, forming the second metal layer, and forming the poly cap layer is each performed through a process selected from the group consisting of: physical vapor deposition (PVD), chemical vapor deposition (CVD), plasma-enhanced CVD (PECVD), atomic layer deposition (ALD), plasma-enhanced ALD (PEALD), radical assisted atomic layer deposition (RAALD), sputtering, MBE, and combinations thereof.

9. The method of claim 8 wherein forming the second metal layer and forming the poly cap layer are performed in separate deposition tool, and wherein the poly cap layer deposition tool includes a metal oxide reduction chamber or a dual-module degas chamber.

10. A method for making a semiconductor device comprising:
    providing a semiconductor substrate;
    forming an interfacial oxide layer at a first region and a second region on the substrate;
    forming a high-k dielectric layer on the interfacial oxide layer at the first and the second regions; and
    forming a first metal layer on the high-k dielectric layer at the first and the second regions, the first metal layer having low oxygen content;
    forming a second metal layer on the first metal layer at the first and the second regions;
    degassing the second metal layer; and
    forming a poly cap layer on the second metal layer at the first and the second regions.

11. The method of claim 10 wherein the semiconductor substrate comprises doped silicon, and the interfacial oxide layer comprises silicon oxide ($SiO_2$).

12. The method of claim 10 wherein forming the first gate metal layer is performed through a substantially non-plasma, and low oxygen content deposition process.

13. The method of claim 10 further comprising patterning the high-k dielectric layer, the first and the second metal layer, and the poly cap layer to form a first gate electrode of an NMOS transistor at the first region, and to form a second gate electrode of a PMOS transistor at the second region.

14. The method of claim 13 wherein the process chamber used in forming the second metal layer and the process chamber used in forming the poly cap layer are on a common clustered process tool.

15. The method of claim 13 wherein forming the second metal layer and forming the poly cap layer are performed in separate process chambers of a common clustered deposition tool, and the poly cap layer deposition tool includes a metal oxide reduction chamber or a dual-module degas chamber.

* * * * *